(12) United States Patent
Shih et al.

(10) Patent No.: US 7,790,487 B2
(45) Date of Patent: Sep. 7, 2010

(54) METHOD FOR FABRICATING PHOTO SENSOR

(75) Inventors: Ching-Chieh Shih, Hsin-Chu (TW);
An-Thung Cho, Hsin-Chu (TW);
Chia-Tien Peng, Hsin-Chu (TW);
Kun-Chih Lin, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 79 days.

(21) Appl. No.: 12/211,106

(22) Filed: Sep. 16, 2008

(65) Prior Publication Data

US 2009/0280606 A1 Nov. 12, 2009

(30) Foreign Application Priority Data

May 9, 2008 (TW) .............................. 97117078 A

(51) Int. Cl.
*H01L 21/00* (2006.01)

(52) U.S. Cl. ........................... 438/30; 438/59; 438/151; 438/158; 438/487; 257/E21.002; 257/E21.414; 257/E29.003; 257/E29.169; 257/E29.293; 257/E45.001; 257/E51.001

(58) Field of Classification Search .................. 438/30, 438/59, 149, 151, 158, 487, 517; 257/E21.002, 257/7, 414, E29.003, 169, 291, 293, 294, 257/E45.001, E51.005

See application file for complete search history.

(56) References Cited

U.S. PATENT DOCUMENTS

| 5,075,244 | A | | 12/1991 | Sakai | |
|---|---|---|---|---|---|
| 5,466,617 | A | * | 11/1995 | Shannon | 438/155 |
| 5,530,265 | A | * | 6/1996 | Takemura | 257/66 |
| 6,100,951 | A | * | 8/2000 | Oversluizen et al. | 349/49 |
| 6,407,393 | B1 | | 6/2002 | Kim | |
| 7,221,039 | B2 | * | 5/2007 | Huang et al. | 257/646 |
| 2006/0180816 | A1 | | 8/2006 | Li | |
| 2006/0205102 | A1 | * | 9/2006 | French et al. | 438/30 |
| 2009/0009675 | A1 | * | 1/2009 | Cho et al. | 349/43 |
| 2009/0153056 | A1 | * | 6/2009 | Chen et al. | 315/51 |
| 2009/0283850 | A1 | * | 11/2009 | Cho et al. | 257/466 |
| 2010/0012937 | A1 | * | 1/2010 | Lee et al. | 257/59 |

FOREIGN PATENT DOCUMENTS

TW 1287628 10/2007

* cited by examiner

*Primary Examiner*—Michael S Lebentritt
(74) *Attorney, Agent, or Firm*—Winston Hsu

(57) ABSTRACT

A method for fabricating a photo sensor on an amorphous silicon thin film transistor panel includes forming a photo sensor with a bottom electrode, a silicon-rich dielectric layer, and a top electrode, such that the light sensor has a high reliability. The fabrication method is compatible with the fabrication process of a thin film transistor.

23 Claims, 24 Drawing Sheets

METHOD FOR FABRICATING PHOTO SENSOR

BACKGROUND OF THE INVENTION

1. Field of the Invention

The present invention relates to a method for fabricating a photo sensor on an amorphous silicon TFT panel, and more particularly, to a method for fabricating a photo sensor, which has a silicon-rich (Si-rich) dielectric layer, on an amorphous TFT panel.

2. Description of the Prior Art

Photo sensors have been widely used in various types of TFT displays. Currently, a photo sensor is normally a p-intrinsic-n (PIN) photodiode formed by IIIA material and VA material. The PIN photodiode, however, has low light receiving efficiency and tends to be influenced by untargeted light sources, and thus suffers disadvantages, e.g. poor signal-to-noise ratio. In addition, the IIIA material and VA material of the PIN photodiode and the TFT fabrication have compatibility problems, which limit the application and productivity of the traditional PIN photodiode. Recently, TFT sensors formed by amorphous silicon material have been developed due to its high photosensitivity. The amorphous silicon TFT sensor, however, has low photo-current stability, which means the photo current decays with time even when the sensor is not operated. Therefore, the reliability is low.

Based on the aforementioned reasons, the conventional photo sensor does not fulfill the requirement in different electro-optical applications, and therefore a new generation of photo sensor is a key to develop.

SUMMARY OF THE INVENTION

It is therefore one of the objectives of the present invention to provide a method of fabricating a photo sensor integrated into the process of an amorphous silicon TFT. The photo sensor of the present invention uses silicon-rich dielectric material, and thus the product reliability is substantially improved.

According to the present invention, a method of fabricating a photo sensor on an amorphous silicon TFT panel is provided. The method includes the following steps. First, a substrate including a TFT region and a sensor region is provided. Then, a first patterned conductive layer is formed on the substrate, where the first patterned conductive layer includes a gate electrode of a TFT disposed in the TFT region. A gate insulating layer is then formed on the substrate and the gate electrode, and a patterned amorphous silicon layer is formed on the gate insulating layer corresponding to the gate electrode. Subsequently, a second patterned conductive layer is formed on the substrate, wherein the second patterned conductive layer includes a source electrode, a drain electrode and a bottom electrode of a photo sensor, the source electrode and the drain electrode are disposed above the gate electrode, and the bottom electrode is disposed in the sensor region. Thereafter, a patterned silicon-rich dielectric layer is formed on the substrate, where the patterned silicon-rich dielectric layer is disposed in the sensor region and electrically connected to the bottom electrode, and the patterned silicon-rich dielectric layer at least partially exposes the drain electrode. Afterward, a patterned transparent conductive layer is formed on the substrate, where the patterned transparent conductive layer includes a top electrode disposed in the sensor region, and the photo sensor is completed.

The photo sensor of the present invention uses silicon-rich dielectric material, and the method of the present invention is integrated into the fabrication of amorphous silicon TFT. Consequently, the overall manufacturing cost of amorphous silicon TFT display panel is reduced, and the product reliability is improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
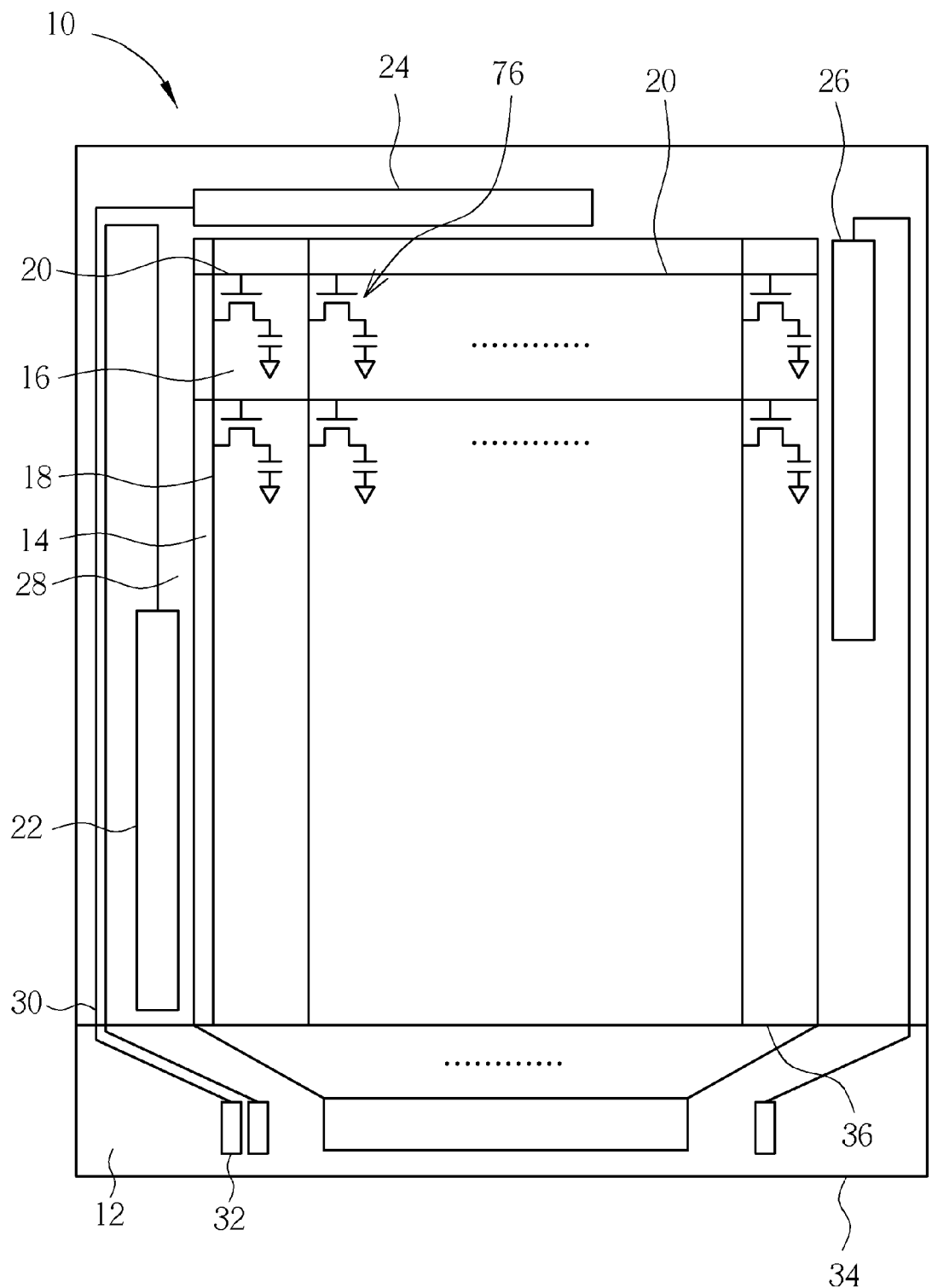
FIG. 1 illustrates a schematic diagram of a photo sensor of an amorphous silicon TFT display panel according to the present invention.

FIG. 1 illustrates a schematic diagram of a photo sensor of an amorphous silicon TFT display panel according to the present invention. As shown in FIG. 1, the amorphous silicon TFT display panel 10 includes a bottom substrate 34 and a top substrate 36. When the amorphous silicon TFT display panel 10 is an LCD panel, the bottom substrate 34 is normally referred to as an array substrate and the top substrate 36 is a color filter substrate. However, the TFT display panel 10 may also be other types of flat display panels, such as an OLED display panel. The amorphous silicon TFT display panel 10 further includes a display region 14 and a peripheral circuit region 12, where the display region 14 includes a plurality of scan lines 20 and signal lines 18, which define a plurality of pixels 16 arranged in matrix. Each pixel 16 includes a TFT 76 electrically connected to the scan line 20 and the signal line 18. In addition, the TFT display panel 10 also includes at least a photo sensor disposed in a sensor region 28 disposed in the periphery of the display region 14. For instance, the photo sensor includes ambient light sensors (ALS) 22, 24, 26 electrically connected to pads 32 disposed on the surface of the bottom substrate 34 via the conductive lines 30.

Figure 2:
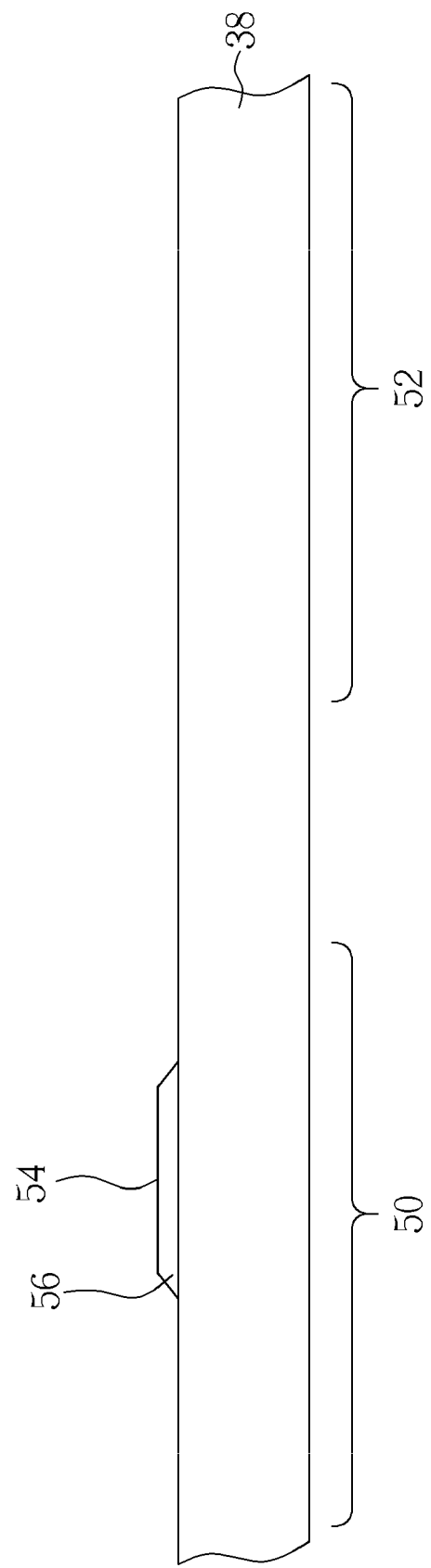
FIGS. 2-7 illustrate cross-sectional views of a method for forming a photo sensor on an amorphous silicon TFT display panel according to a first embodiment of the present invention.
Figure 3:
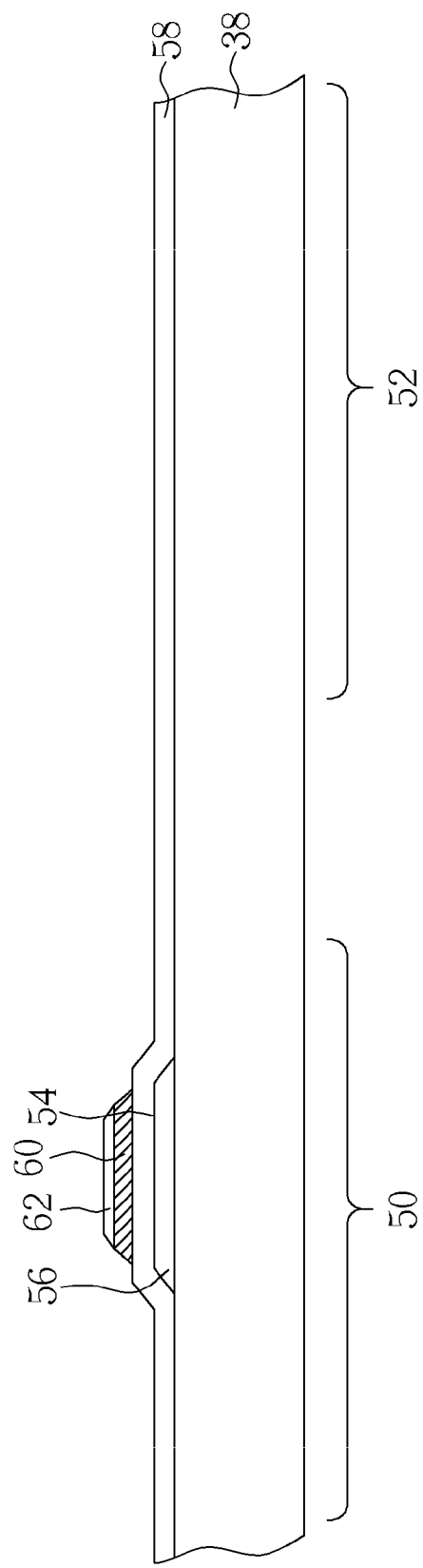

FIGS. 2-7 illustrate cross-sectional views of a method for forming a photo sensor on an amorphous silicon TFT display panel according to a first embodiment of the present invention. As shown in FIG. 2, a substrate 38 is provided. The substrate 38, which may be an array substrate of a flat display panel, includes at least a TFT region 50, and at least a sensor region 52. A first conductive layer is then entirely deposited on the substrate 38, and a first photolithographic and etching process using a first mask is performed to form a first patterned conductive layer 54. The first pattern conductive layer 54 is preferably metal material, and includes a gate electrode 56 disposed in the TFT region 50. As shown in FIG. 3, a gate insulating layer 58 is deposited on the substrate 38 and the gate electrode 56, and an amorphous silicon layer and a doped amorphous silicon layer are consecutively formed on the gate insulating layer 58. A second photolithographic and etching process using a second mask is performed to pattern the amorphous silicon layer and the doped amorphous silicon layer to form a patterned amorphous silicon layer 60 and a patterned doped amorphous silicon layer 62 on the gate insulating layer 58 corresponding to the gate electrode 56, where the patterned amorphous silicon layer 60 includes a semiconductor channel of a TFT.

Figure 4:
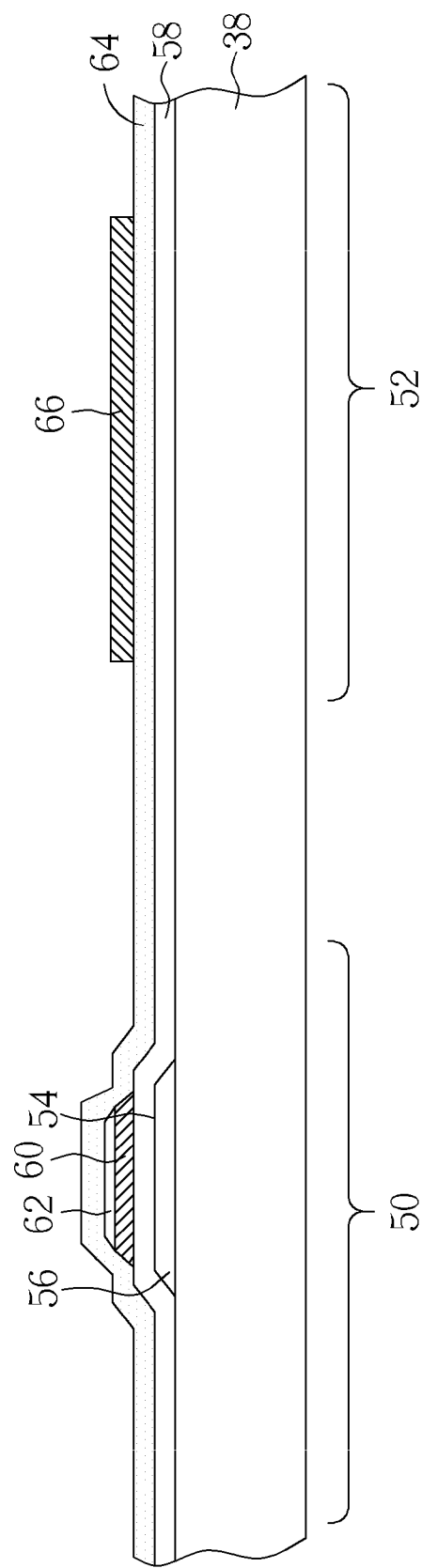

As shown in FIG. 4, a second conductive layer 64, and a silicon-rich dielectric layer 66 containing silicon-rich atoms are consecutively formed on the substrate 38. The silicon-rich dielectric layer 66 is a dielectric layer with excellent photosensitivity, and is a compound of silicon, oxygen, nitrogen, carbon, or hydrogen. Subsequently, a first photoresist layer (not shown) is coated on the substrate 38, and a third photolithographic and etching process using a third mask is performed to define the pattern corresponding to the sensor region 52. The silicon-rich dielectric layer 66 is partially removed by dry or wet etching to form the patterned silicon-rich dielectric layer 66 in the sensor region 52, and the first photoresist layer is then removed. It is appreciated that the molecular formula of the silicon-rich dielectric layer 66 includes SiOC, SiC, SiOx, SiNx, SiONy, SiOH, or any combination thereof. The silicon-rich dielectric layer 66 may be formed by introducing gases containing silicon, oxygen, nitrogen, carbon, hydrogen, or a mixture thereof and then performing a chemical vapor deposition (CVD) process. For instance, the silicon-rich dielectric layer 66 containing SiOx may be formed by implementing a CVD process introducing $SiH_4/N_2O$, or the silicon-rich dielectric layer 66 containing SiOH may be formed by implementing a CVD process introducing $SiH_4/N_2O/H_2$. In addition, the silicon-rich dielectric layer 66 is photosensitive, and therefore the composition may be adjusted to control the photosensitivity with respect to light beams of different colors. Also, a laser annealing process may be selectively performed when forming the silicon-rich dielectric layer 66 to form silicon nanocrystals in the silicon-rich dielectric layer 66.

Figure 5:
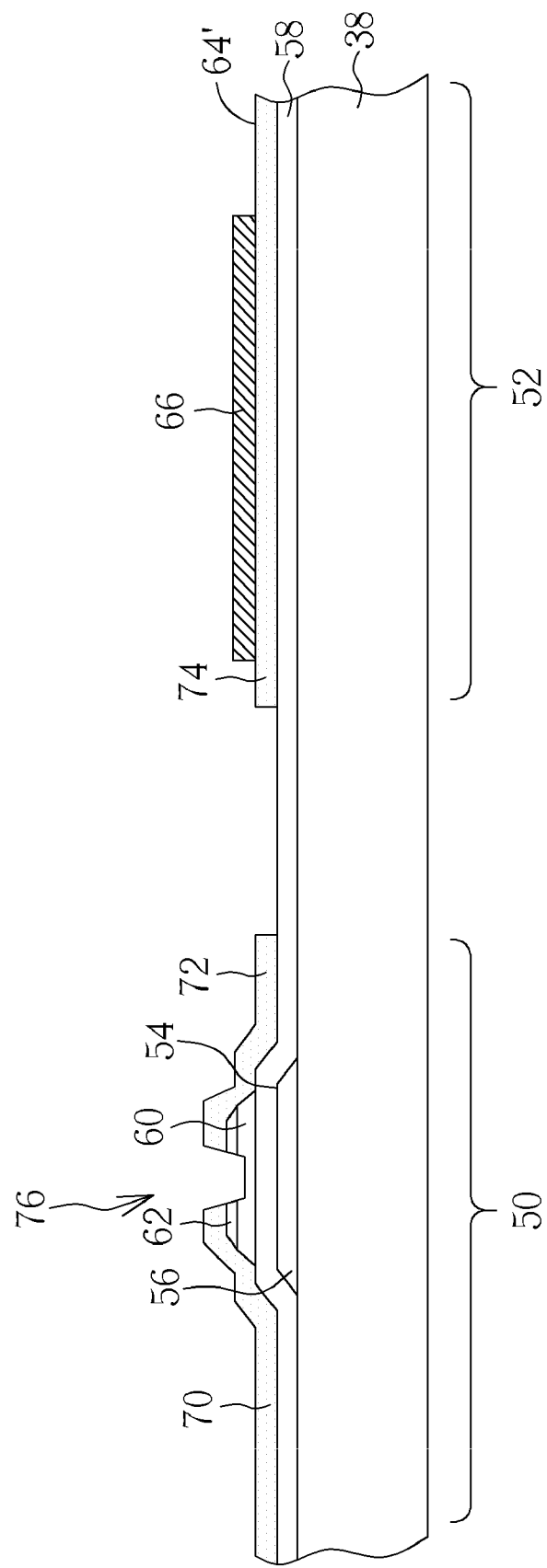

As shown in FIG. 5, a second photoresist layer (not shown) is formed on the substrate 38, and a fourth photolithographic and etching process using a fourth mask is performed. After the exposure and development, the second conductive layer 64 not covered by the second photoresist layer is removed by dry or wet etching to form a second patterned conductive layer 64', which includes a source electrode 70 and a drain electrode 72 electrically disconnected to each other in the TFT region 50, and a bottom electrode 74 of a photo sensor in the sensor region 52. It is appreciated that a portion of the doped amorphous silicon layer 62 is also removed in the fourth photolithographic and etching process, and the source electrode 70 and the drain electrode 72 are respectively electrically connected to the patterned amorphous silicon layer 60 via the remaining doped amorphous silicon layer 62. Accordingly, a TFT 76 is formed on the substrate 38. In addition, the bottom electrode 74 disposed in the sensor region 52 is under the patterned silicon-rich dielectric layer 66, and electrically connected to the silicon-rich dielectric layer 66. It is appreciated that the sequence of the third and fourth photolithographic and etching processes may be swapped. For example, subsequent to forming the second conductive layer 64, the fourth photolithographic and etching process can be immediately carried out to pattern the second conductive layer 64 to form a second patterned conductive layer 64' including the source electrode 70, the drain electrode 72, and the bottom electrode 74. Subsequently, the silicon-rich dielectric layer 66 is formed, and the third photolithographic and etching process is performed to form the pattern silicon-rich dielectric layer 66 in the sensor region 52.

Figure 6:
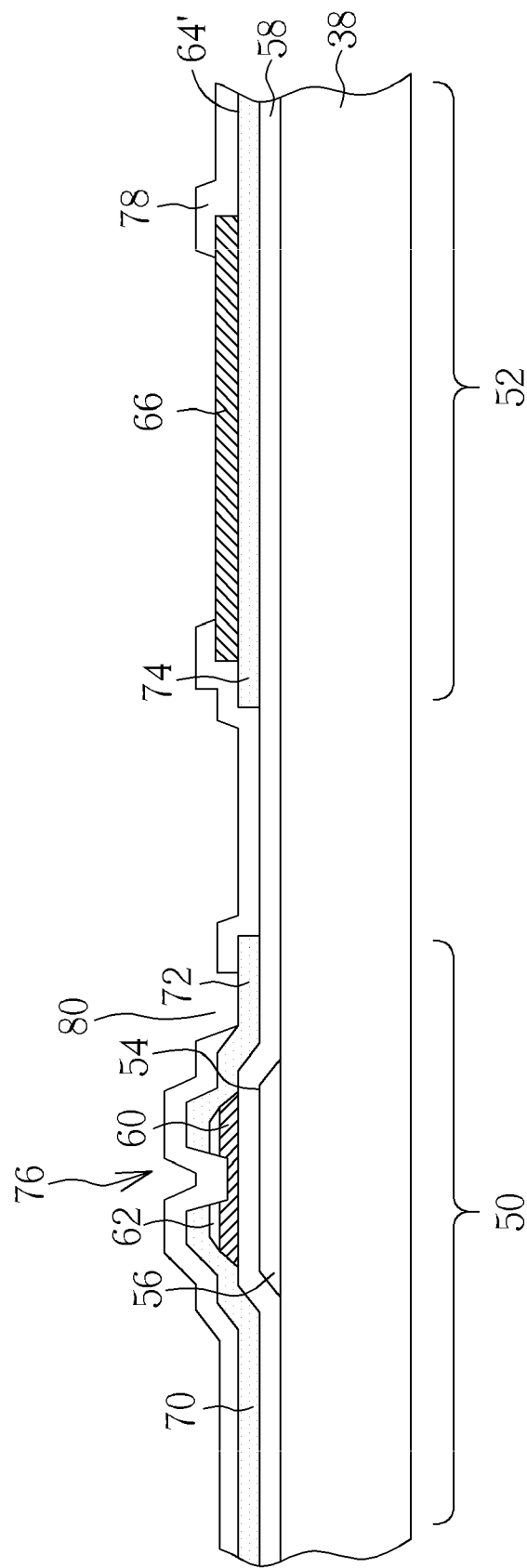

As shown in FIG. 6, a passivation layer 78 with good water resistance is entirely deposited on the substrate 38. The passivation layer 78 may include inorganic material e.g. silicon nitride or silicon oxide. Then, a fifth photolithographic and etching process using a fifth mask is performed to partially remove the passivation layer 78 to form a through hole 80, and to expose a portion of the drain electrode 72 and most part of the patterned silicon-rich dielectric layer 66.

Figure 7:
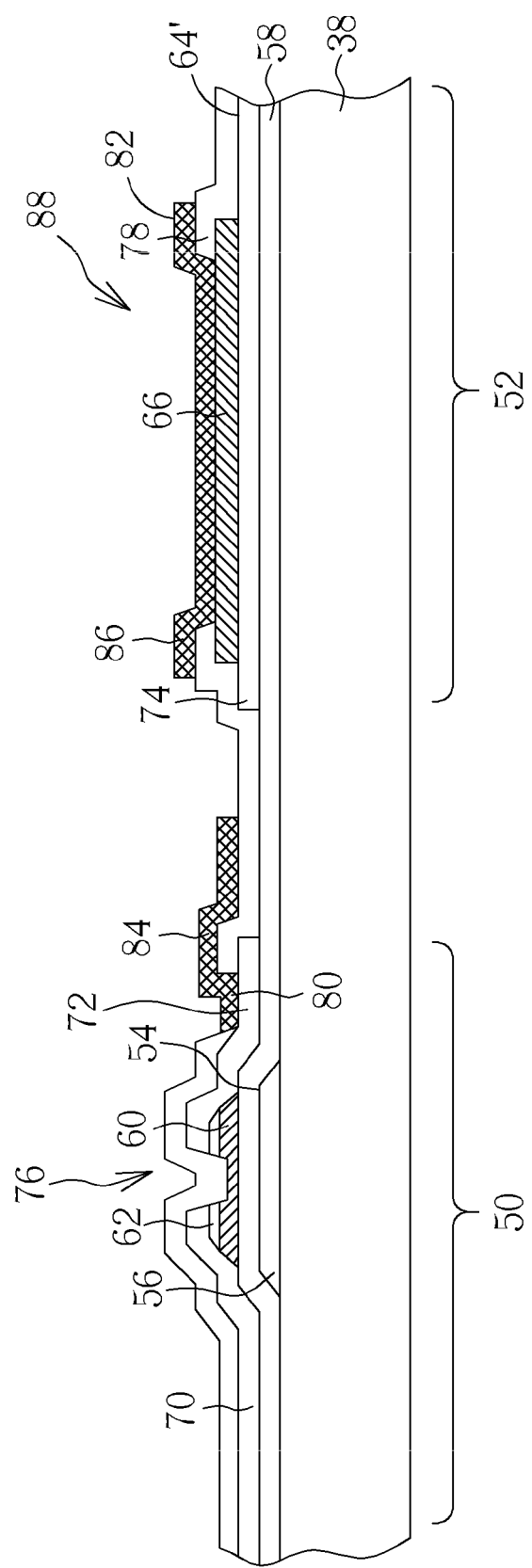

As shown in FIG. 7, a transparent conductive layer such as indium tin oxide (ITO) or indium zinc oxide (IZO) is deposited, and a sixth photolithographic and etching process using a six mask is implemented to form a patterned transparent conductive layer 82. The patterned transparent conductive layer 82 includes a pixel electrode 84 disposed in the TFT region 50, and a top electrode 86 disposed in the sensor region 52. The pixel electrode 84 is electrically connected to the drain electrode 72 via the patterned transparent conductive layer 82 filled into the through hole 80. The top electrode 86 is disposed on the surface of the silicon-rich dielectric layer 66, and the top electrode 86, the silicon-rich dielectric layer 66, and the bottom electrode 74 constitute a photo sensor 88.

Figure 8:
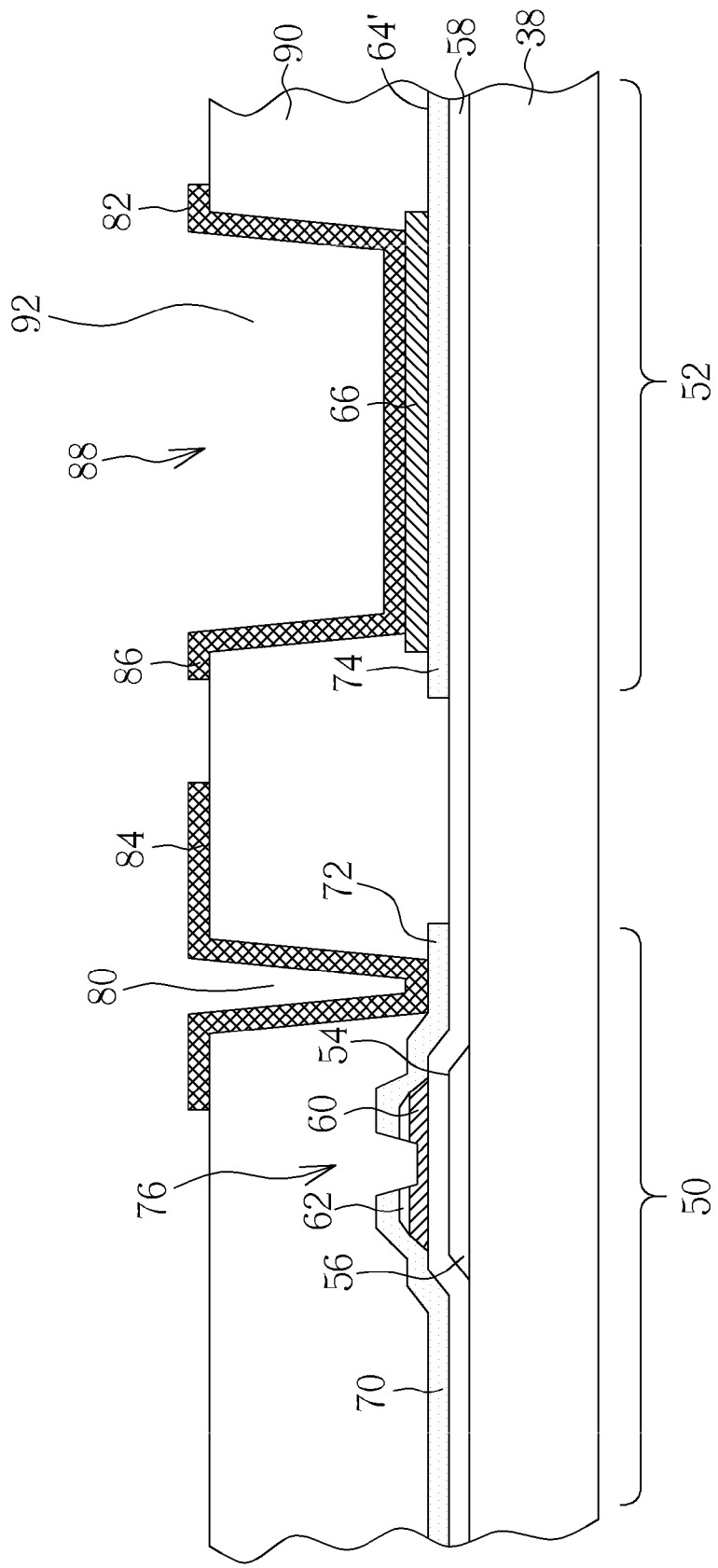
FIG. 8 illustrates a cross-sectional view of a method for forming a photo sensor on an amorphous silicon TFT display panel according to a second embodiment of the present invention.

FIG. 8 illustrates a cross-sectional view of a method for forming a photo sensor on an amorphous silicon TFT display panel according to a second embodiment of the present invention, where FIG. 8 follows the steps described in FIG. 5 of the first embodiment. In this embodiment, organic material is used to replace the passivation layer 78 of the first embodiment. As shown in FIG. 8, after forming the source electrode 70, the drain electrode 72, the bottom electrode 74, and the silicon-rich dielectric layer 66, a planarization layer 90, which serves as a passivation of the TFT 76, is formed on the substrate 38 to cover the TFT 76 and the silicon-rich dielectric layer 66. The planarization layer 90 includes photoresist material e.g. organic photoresist layer. Then, an exposure and development is implemented to pattern the planarization layer 90 to form through holes 80, 92, where the through hole 80 partially exposes the drain electrode 72, and the through hole 92 partially exposes the silicon-rich dielectric layer 66. Subsequently, a patterned transparent conductive layer 82 covering the drain electrode 72 exposed by the through hole 80 in the TFT region 50, and covering the silicon-rich dielectric layer 66 exposed by the through hole 92 in the sensor region 52 is formed as described in the first embodiment. The portion of the patterned transparent conductive layer 82 electrically connected to the silicon-rich dielectric layer 66 serves as a top electrode 56. Accordingly, the photo sensor 88 integrated into the fabrication of amorphous silicon TFT 76 is completed.

Figure 9:
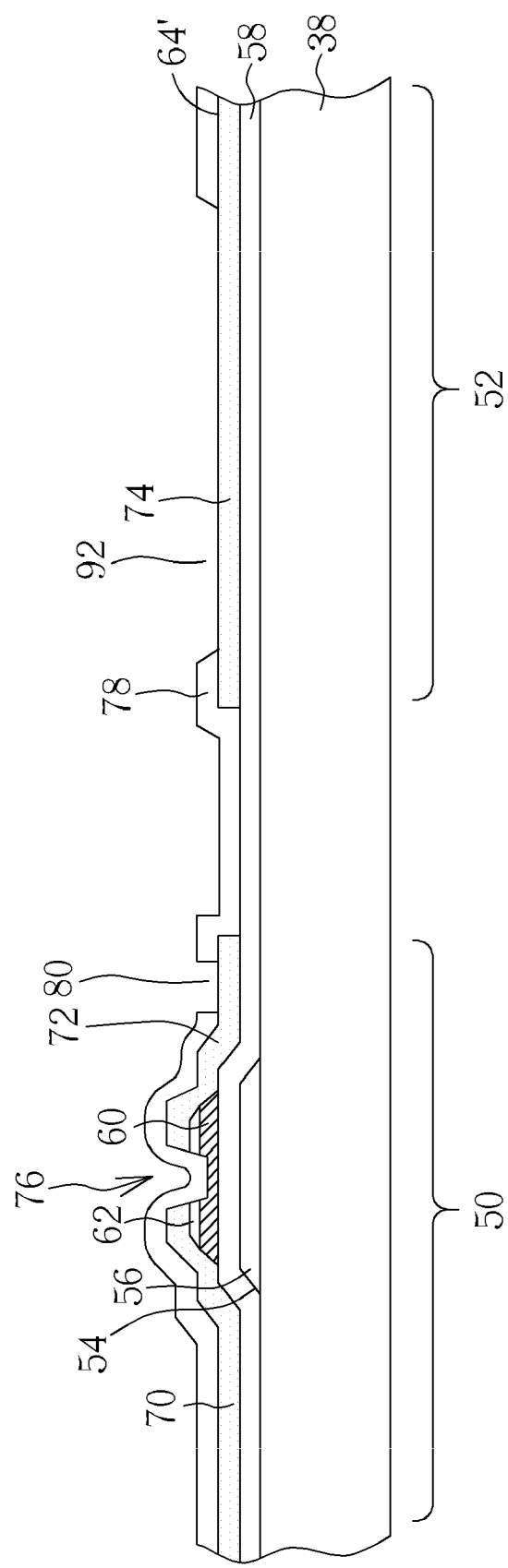
FIGS. 9-10 illustrate a method of forming a photo sensor according to a third embodiment of the present invention.
Figure 10:
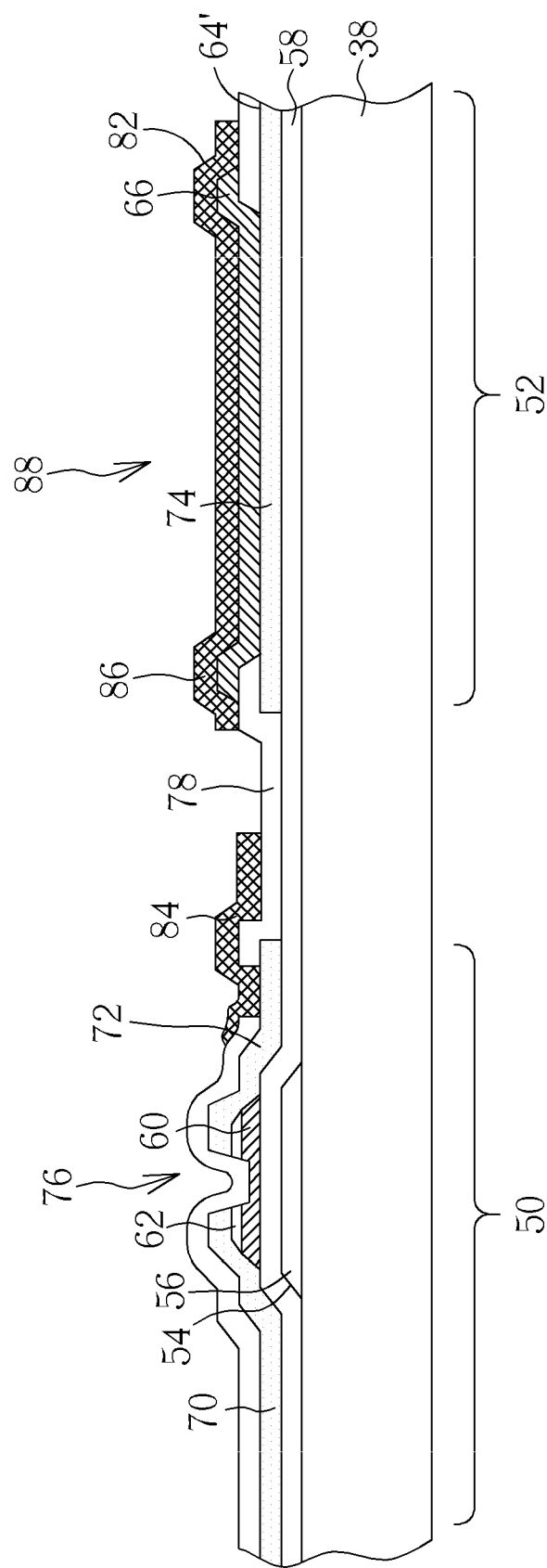

FIGS. 9-10 illustrate a method of forming a photo sensor according to a third embodiment of the present invention, where FIG. 9 follows FIG. 3. As shown in FIG. 9, after forming the patterned amorphous silicon layer 60 and the doped amorphous silicon layer 62, a second patterned conductive layer 64' including a source electrode 70, a drain electrode 72 and a bottom electrode 74 is formed on the substrate 38. The second patterned conductive layer 64' may be formed by the following steps. First, a second conductive layer (as the second conductive layer 64 shown in FIG. 4) and a photoresist layer (not shown) are entirely deposited on the substrate 38. Then, a photolithographic and etching process is performed to partially remove the second conductive layer 64 and the doped amorphous silicon layer 62. Subsequently, a patterned passivation layer 78 including a through hole 80 partially exposing the drain electrode 72 and a through hole 92 exposing most of the bottom electrode 74 is formed on the substrate 38.

As shown in FIG. 10, a silicon-rich dielectric layer 66 is formed on the substrate 38. A photolithographic and etching process is performed to partially remove the silicon-rich dielectric layer 66 so that the patterned silicon-rich dielectric layer 66 is disposed in the sensor region 52. In other embodiment, the silicon-rich dielectric layer 66 may be both in the sensor region 52 and in the TFT region 50. Then, a patterned transparent conductive layer 82 including a pixel electrode 84 electrically connected to the drain electrode 72, and a top electrode 86 of the photo sensor 88 electrically connected to the silicon-rich dielectric layer 66 is formed on the substrate 38. Different from the first embodiment, the passivation layer 78 is formed prior to forming the silicon-rich dielectric layer 66 on the substrate 38 in this embodiment.

Figure 11:
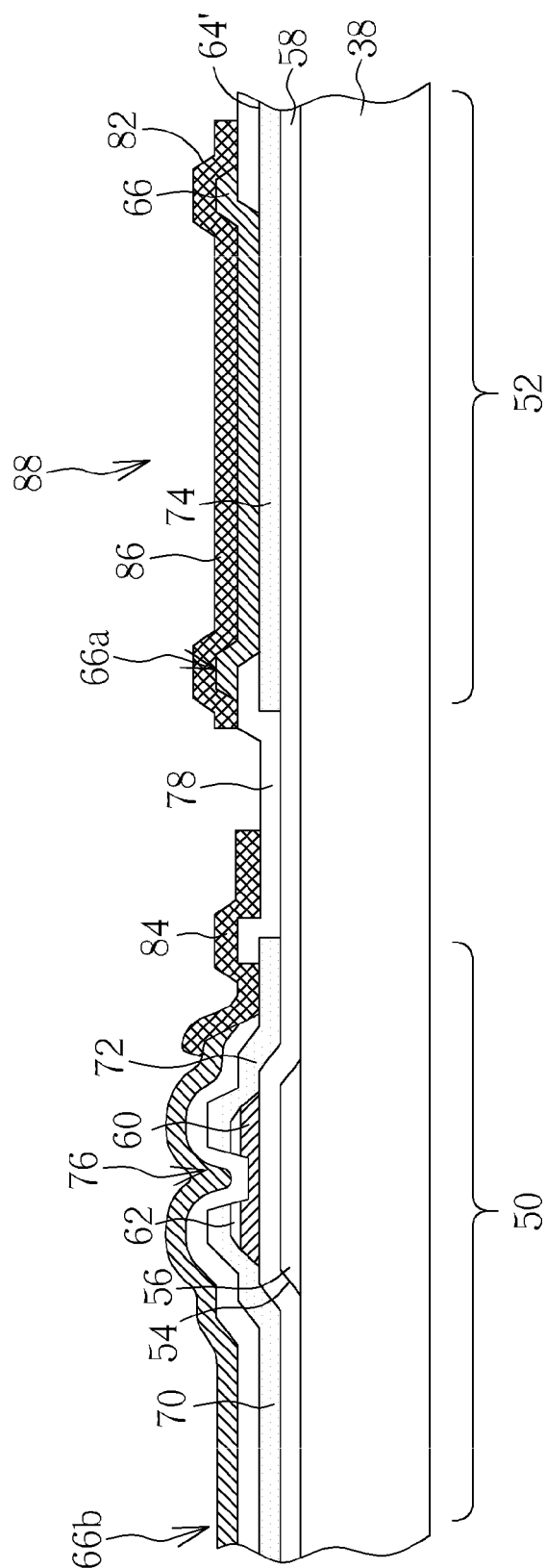
FIG. 11 illustrates a method for forming a photo sensor according to a fourth embodiment of the present invention.

In other embodiments of the present invention, the silicon-rich dielectric layer 66 is formed in the TFT region 50 as well as in the sensor region 52. FIG. 11 illustrates a method for forming a photo sensor according to a fourth embodiment of the present invention, where FIG. 11 follows the fabrication of FIG. 9. As shown in FIG. 11, after forming the TFT 76 and the passivation layer 78, a patterned silicon-rich dielectric layer 66 is formed on the substrate 38. The silicon-rich dielectric layer 66 includes a first part 66a disposed in the sensor region 52, and a second part 66b disposed in the TFT region 50, where the first part 66a is used as the photosensitive material of the photo sensor 88, and the second part 66b is used as another passivation layer of the TFT 76, the source electrode 70 and the drain electrode 72. The patterned silicon-rich dielectric layer 66 may be formed by the following steps. First, a silicon-rich dielectric layer 66 is entirely deposited on the substrate 38. Then, a photolithographic and etching process is performed to partially remove the silicon-rich dielectric layer 66 to form a first part 66a in the sensor region 52, and a second part 66b in the TFT region 50. Subsequently, a patterned transparent conductive layer 82 including a top electrode 86 corresponding to the sensor region 52, and a pixel electrode 84 corresponding to the TFT region 50 is formed on the substrate 38.

Figure 12:
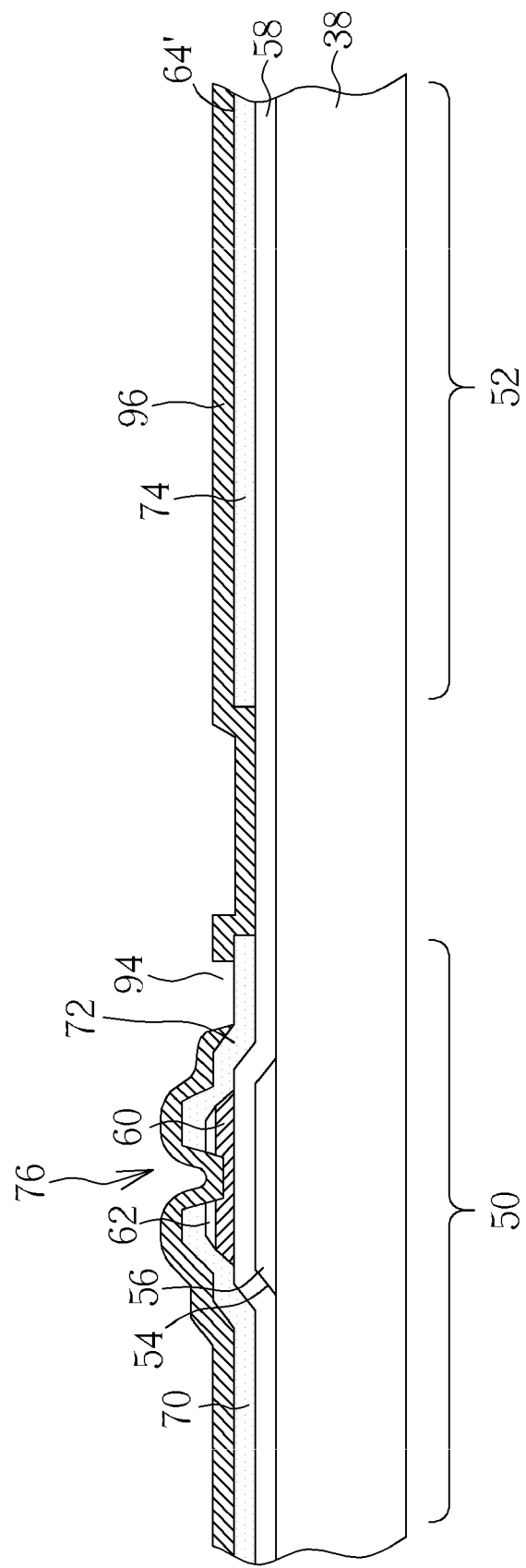
FIGS. 12-13 illustrate a method of forming a photo sensor according to a fifth embodiment of the present invention.
Figure 13:
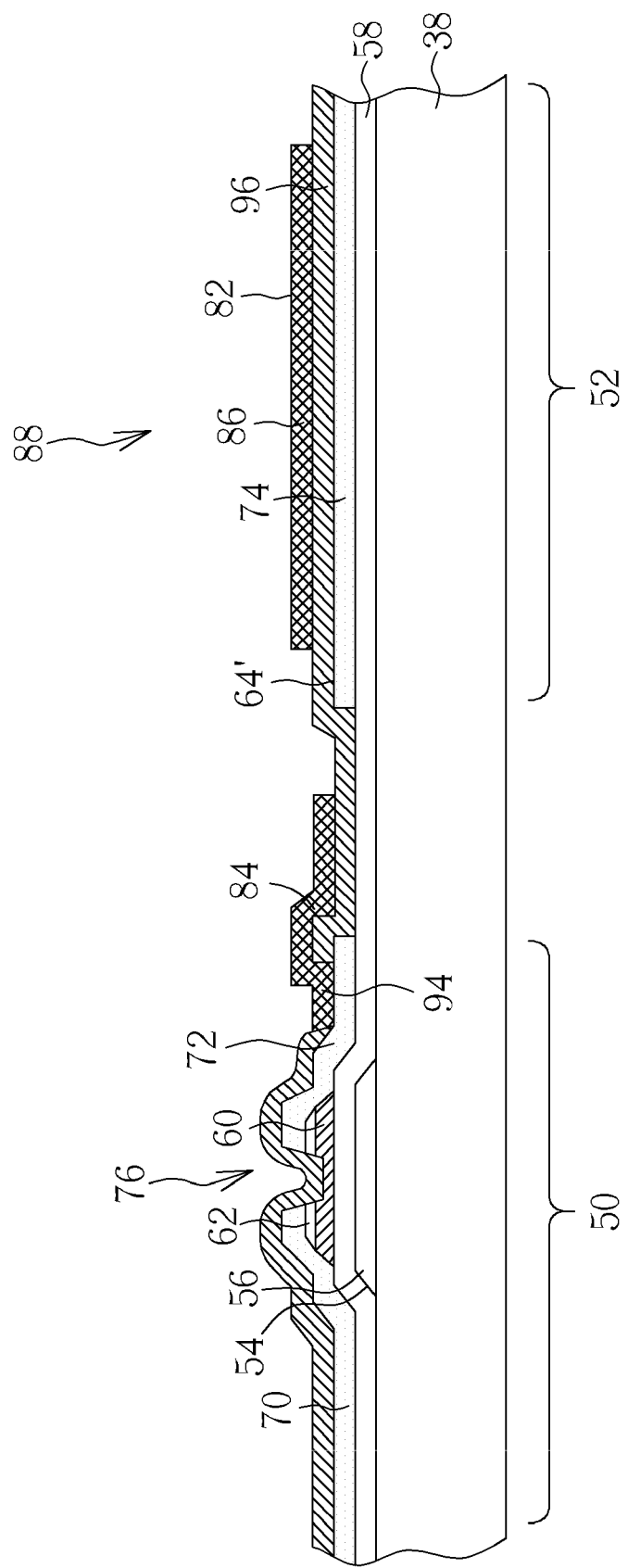

FIGS. 12-13 illustrate a method of forming a photo sensor according to a fifth embodiment of the present invention. In this embodiment, the silicon-rich dielectric layer 66 replaces the passivation layer 78 of the third embodiment. FIG. 12 follows the fabrication illustrated in FIG. 9. As described in the third embodiment, after forming the patterned amorphous silicon layer 60 and the doped amorphous silicon layer 62, a second patterned conductive layer 64' including a source electrode 70, a drain electrode 72 and a bottom electrode 74 is formed on the substrate 38, and the doped amorphous silicon layer 62 is partially removed to form a TFT 76. A silicon-rich dielectric layer 96 is entirely deposited, and then partially removed by photolithographic and etching techniques so that the remaining silicon-rich dielectric layer 96 covers most part of the TFT 76 and the bottom electrode 74, and a through hole 94 is formed to partially expose the drain electrode 72. As shown in FIG. 13, a patterned transparent conductive layer 82 is formed on the substrate 38, where the patterned transparent conductive layer 82 includes a pixel electrode 84 electrically connected to the drain electrode 72, and a top electrode 86 disposed in the sensor region 52. Accordingly, the photo sensor 88 integrated into the fabrication of the amorphous silicon TFT 76 according to the fifth embodiment is completed.

Figure 14:
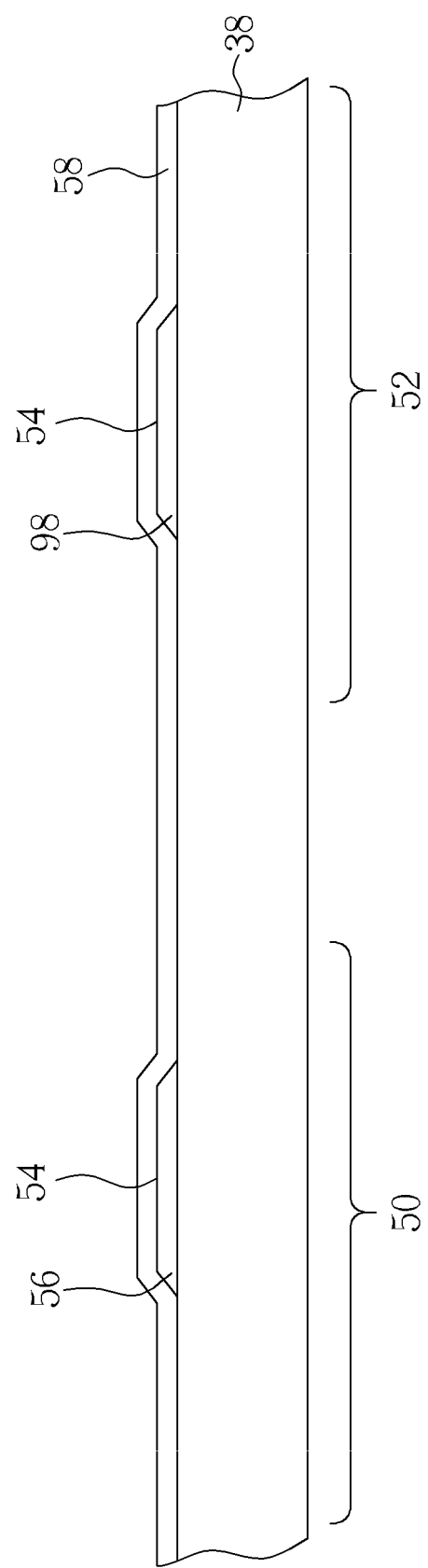
FIGS. 14-19 illustrate a method of forming a photo sensor according to a sixth embodiment of the present invention.

FIGS. 14-19 illustrate a method of forming a photo sensor according to a sixth embodiment of the present invention. In this embodiment, it requires only four masks to fabricate the photo sensor in the amorphous silicon TFT display panel. To simplify the description, identical components are denoted by identical numerals. As shown in FIG. 14, a substrate 38 having a TFT region 50 and a sensor region 52 defined thereon is provided. Than, a first conductive layer is deposited on the substrate 38, and patterned by performing a photolithographic and etching process using a first mask to form a first patterned conductive layer 54 including a gate electrode 56 disposed in the TFT region 50. In this embodiment, the first patterned conductive layer 54 may further include a conductive line 98 disposed in the sensor region 52. However, the first pattern conductive layer 54 may exclude the conductive line 98 of the sensor region 52 in other embodiment. Subsequently, a gate insulating layer 58 covering the gate electrode 56 and the conductive line 98 is formed on the substrate 38.

Figure 15:
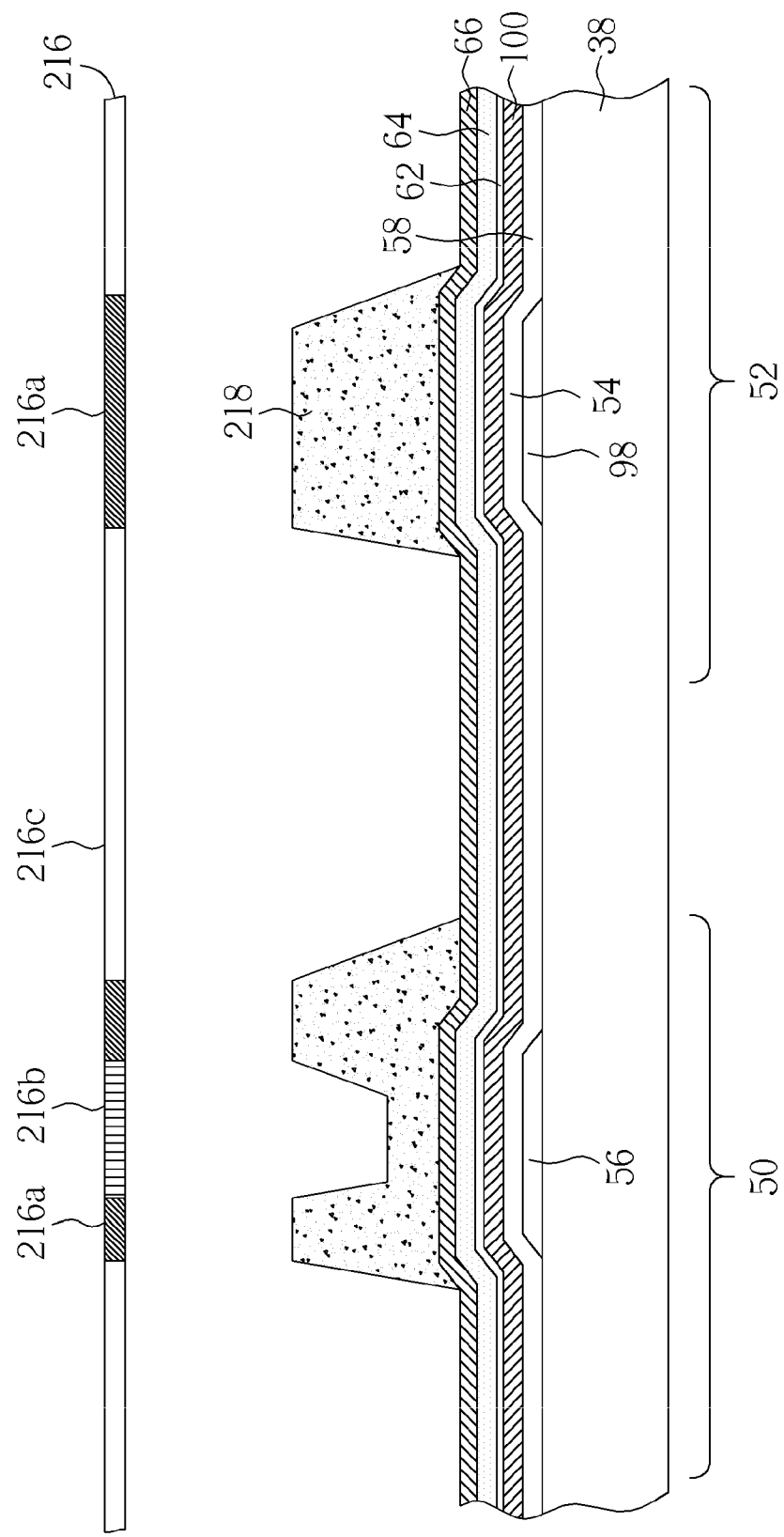
Figure 16:
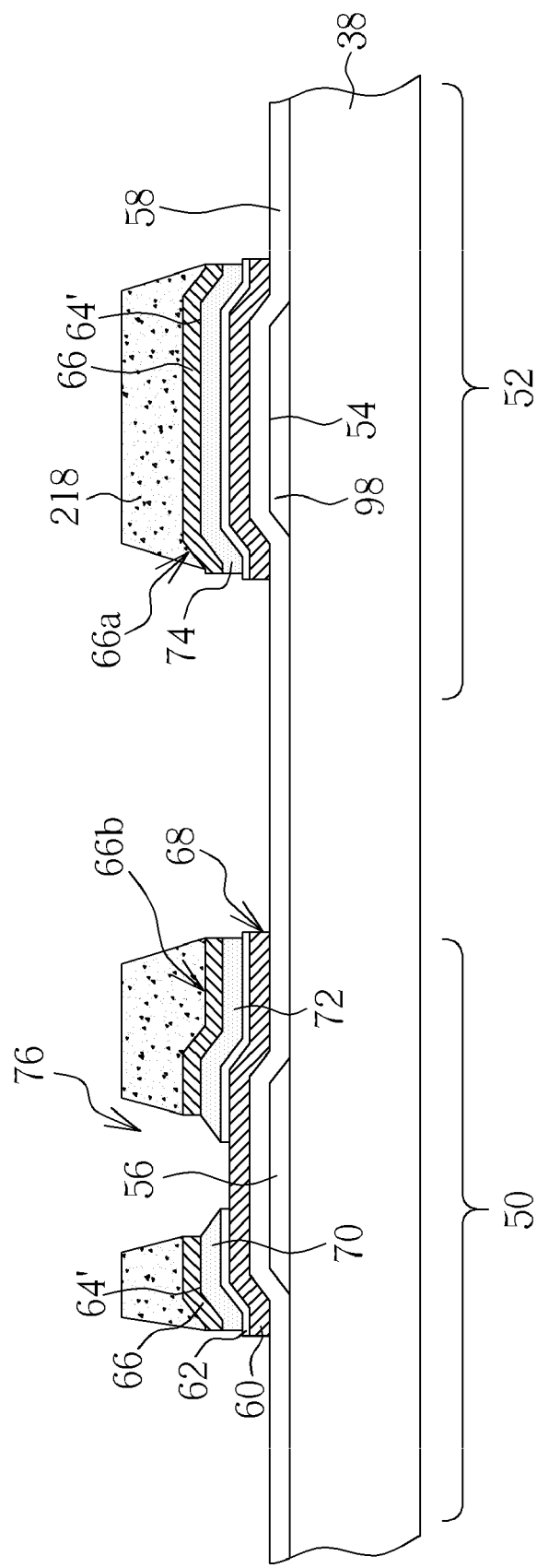

As shown in FIG. 15, an amorphous silicon layer 100, a doped amorphous silicon layer 62, a second conductive layer 64, and a silicon-rich dielectric layer 66 are consecutively formed on the substrate 38. A photoresist layer 218 is then formed on the substrate 38, and a second mask 216 is used to define the locations of a source electrode 70, a drain electrode 72, a semiconductor channel 68 (i.e. semiconductor region), a photosensitive material of the photo sensor, a bottom electrode 74 to be formed. The second mask may include a graytone mask, a halftone mask or a phase shift mask. When the second mask 216 is a halftone mask, the second mask 216 includes an opaque region 216a corresponding to the source electrode 70, the drain electrode 72 and the bottom electrode 74 to be formed, a translucent region 216b corresponding to the semiconductor channel to be formed, and a transparent region 216c corresponding to the region other than the TFT region 50 and the sensor region 52. As shown in FIG. 16, an etching process is performed to remove the silicon-rich dielectric layer 66, the second conductive layer 64', the doped amorphous silicon layer 62 and the amorphous silicon layer 100 not covered by the photoresist layer 218, so as to form the semiconductor channel 68, the source electrode 70, the drain electrode 72, the bottom electrode 74, and the patterned silicon-rich dielectric layer 66. The silicon-rich dielectric layer 66 includes a first part 66a disposed in the sensor region 52 and over the surface of the bottom electrode 74, and a second part 66b disposed on the source electrode 70 and the drain electrode 72, where the first part 66a has a pattern of photosensitive material.

Figure 17:
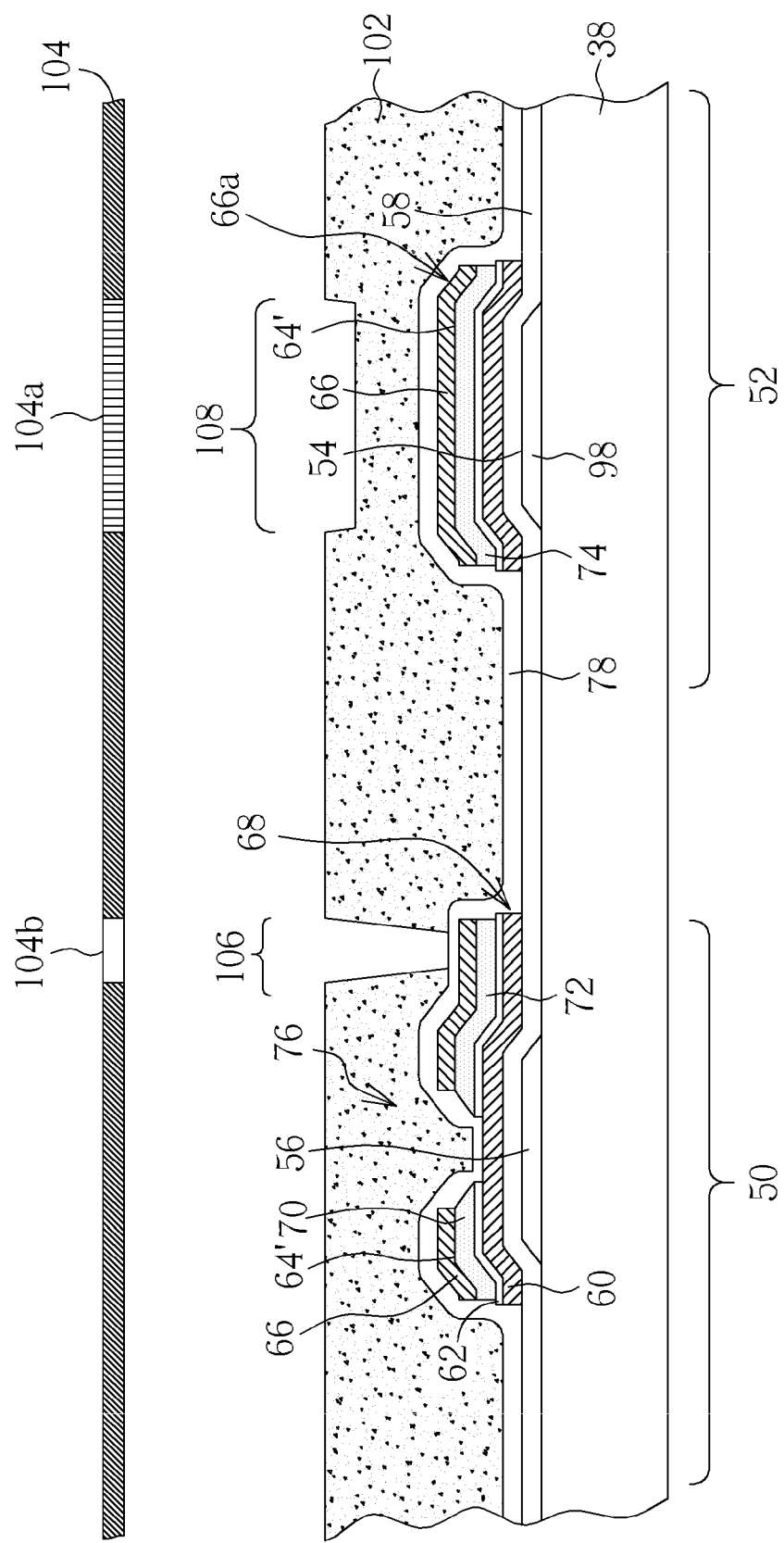

As shown in FIG. 17, the photoresist layer 218 is removed, and a passivation layer 78 and a photoresist layer 102 are consecutively formed on the substrate 38. Then, a third mask 104 is used to perform a photolithographic process upon the photoresist layer 102. The third mask 104 may include a graytone mask, a halftone mask or a phase shift mask. When a halftone mask is used, the third mask 104 includes a translucent region 104a substantially corresponding to the first part 66a of the silicon-rich dielectric layer 66 in the sensor region 52, and a transparent region 104b corresponding to the location corresponding to the drain electrode 74 where a through hole pattern is to be formed. Subsequently, a development process is implemented to pattern the photoresist layer 102 to form a through hole pattern 106 and an opening pattern 108, where the through hole pattern 106 partially exposes the passivation layer 78.

Figure 18:
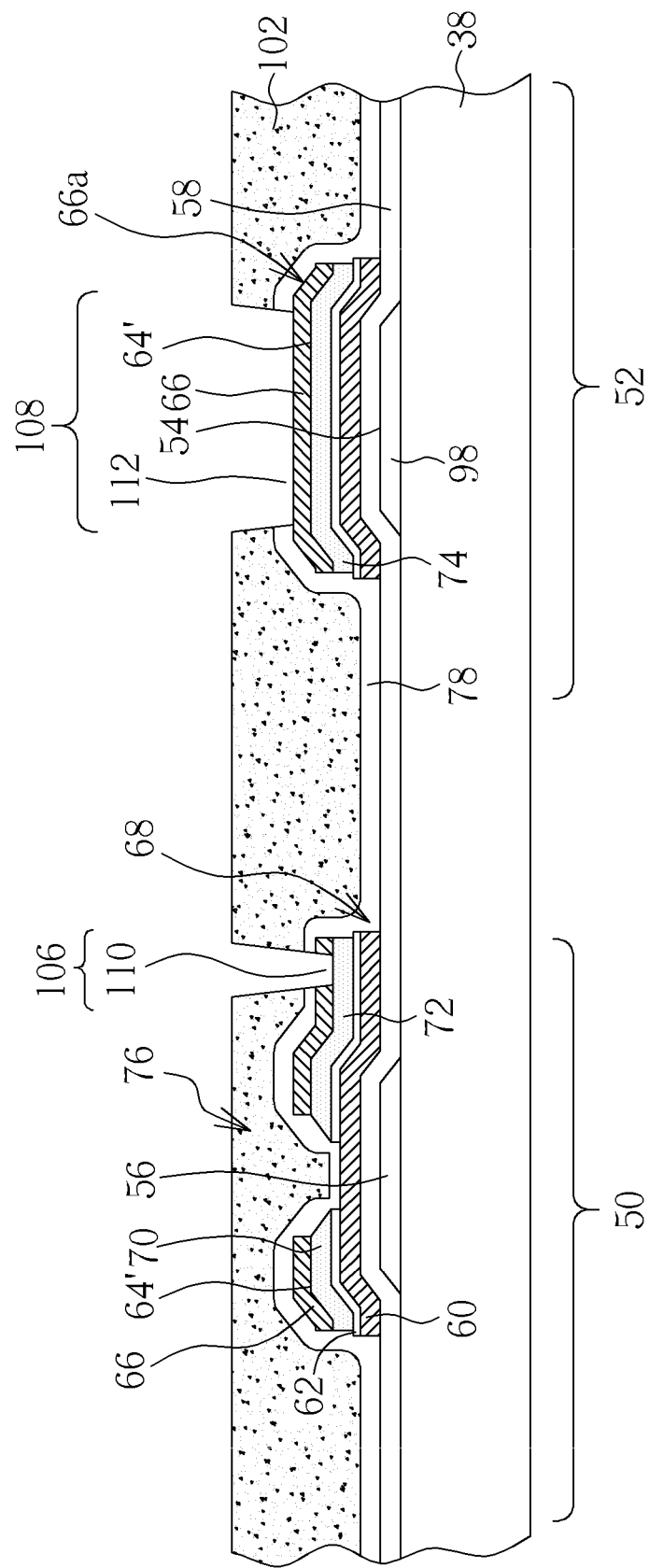

As shown in FIG. 18, an anisotropic etching process is performed using the patterned photoresist layer 102 as an etching mask to partially remove the passivation layer 78 and the silicon-rich dielectric layer 66 so as to form a through hole 110 in the TFT region 50, and an opening 112 in the sensor region 52. The through hole 110 partially exposes the drain electrode 72, and the opening 112 partially exposes the first part 66a of the silicon-rich dielectric layer 66.

Figure 19:
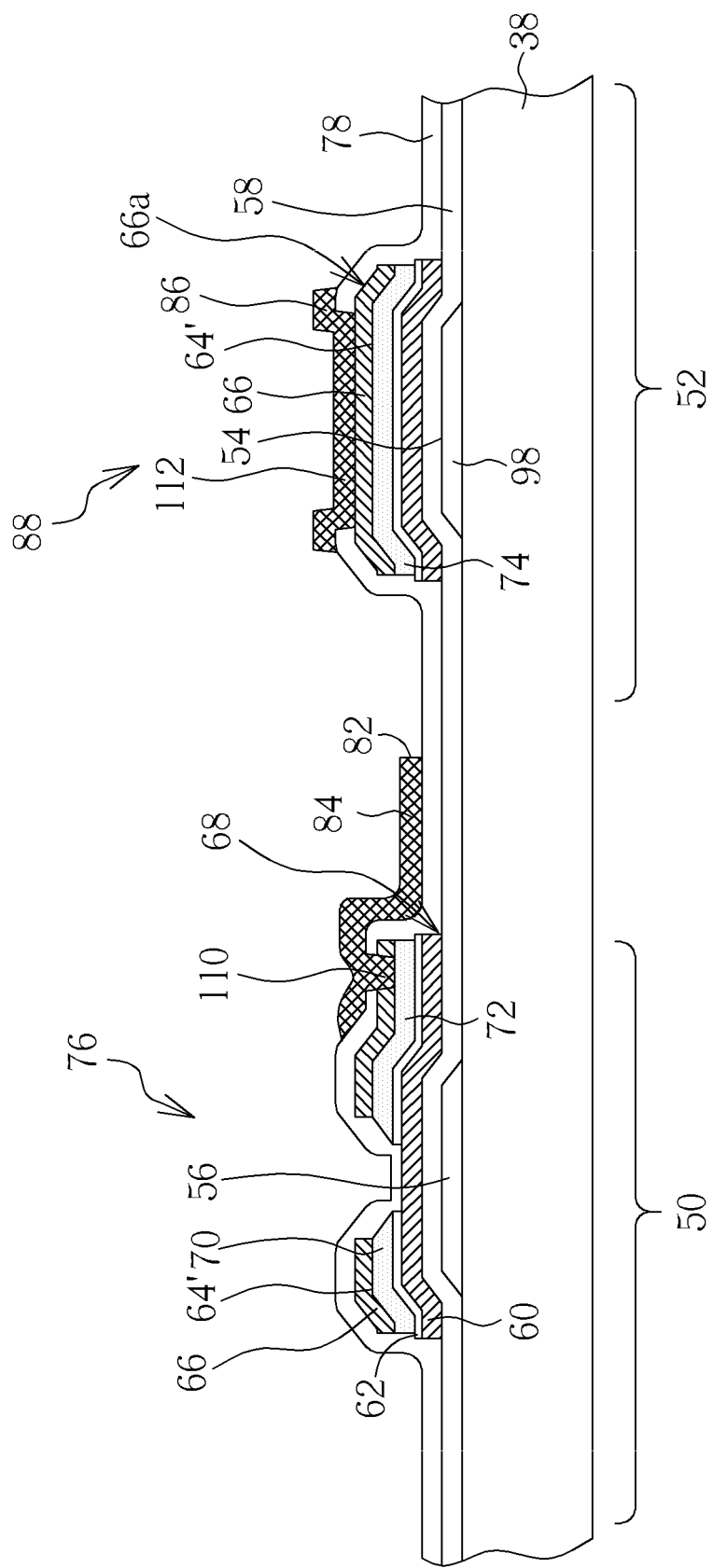

As shown in FIG. 19, a pattern transparent conductive layer 82 is formed on the substrate 38 by the following steps. A transparent conductive layer and a photoresist layer (not shown) are entirely formed on the substrate 38, and a photolithographic and etching process using a fourth mask is carried out to partially remove the transparent conductive layer, thereby forming a pixel electrode 84 filling into the through hole 110 and electrically connected to the drain electrode 72 in the TFT region 50, and a top electrode 86 filling into the opening 112 and disposed on the surface of the first part 66a of the silicon-rich dielectric layer 66 in the sensor region 52.

Figure 20:
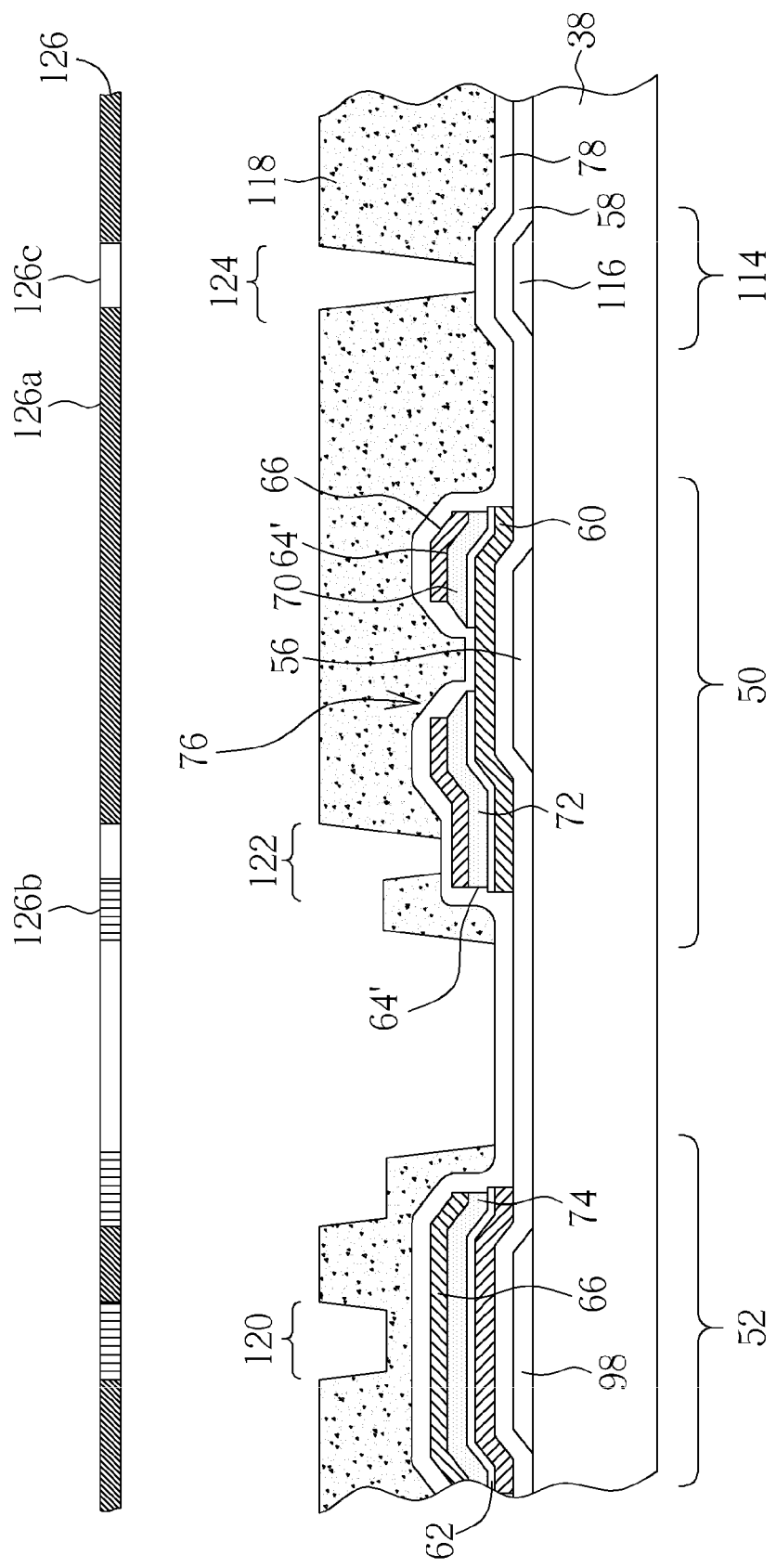
FIGS. 20-23 illustrate a method of forming a photo sensor integrated into the fabrication of an amorphous silicon TFT according to a seventh embodiment of the present invention.

FIGS. 20-23 illustrate a method of forming a photo sensor integrated into the fabrication of an amorphous silicon TFT according to a seventh embodiment of the present invention. In this embodiment, it requires only three masks and three photolithographic processes to fabricate the photo sensor and the TFT in the amorphous silicon TFT display panel. As shown in FIG. 20, a substrate 38 having a TFT region 50, a sensor region 52, and a pad region 114 defined thereon is provide. Subsequently, a TFT 76 and a silicon-rich dielectric layer 66 are formed as described in FIGS. 14-16. In this embodiment, a bottom pad 116 is formed simultaneously with the gate electrode 56, and the gate insulating layer 58 is formed to cover the bottom pad 116 in the pad region 114 as well as the gate electrode 56. Then, the steps illustrated in FIG. 16 is completed, and the photoresist layer 218 is removed. Subsequently, a passivation layer 78 and a photoresist layer 118 are consecutively formed on the substrate 38, and a photolithographic and development process using a third mask 126 is performed to pattern the photoresist layer 118. Accordingly, an opening pattern 120, a through hole pattern 122 and a pad pattern 124 are defined in the photoresist layer 118. The third mask 126 includes an opaque region 126a corresponding to a portion of the passivation layer 78 to be reserved, a transparent region 126c corresponding to the pad pattern 124 and the through hole pattern 122, and a translucent region 126b corresponding to the opening pattern 120 and selectively corresponding to one side of the through hole pattern 122 and the edge of the sensor region 52 wherever necessary.

Figure 21:
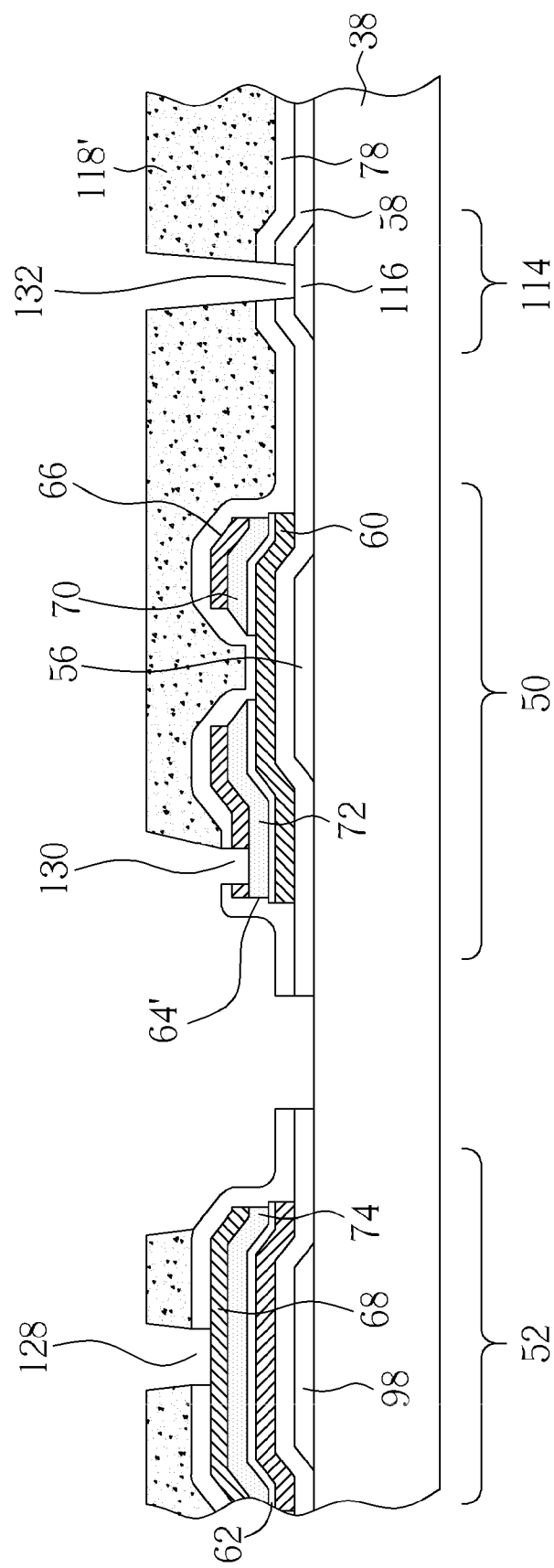
Figure 22:
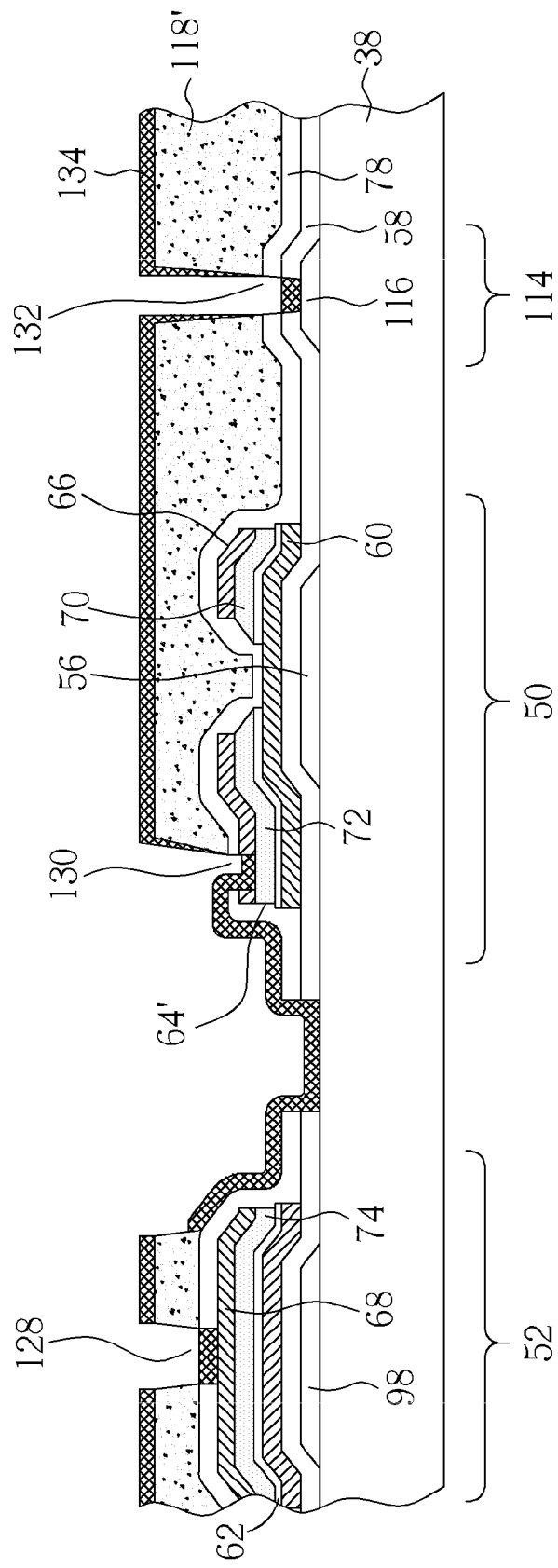
Figure 23:
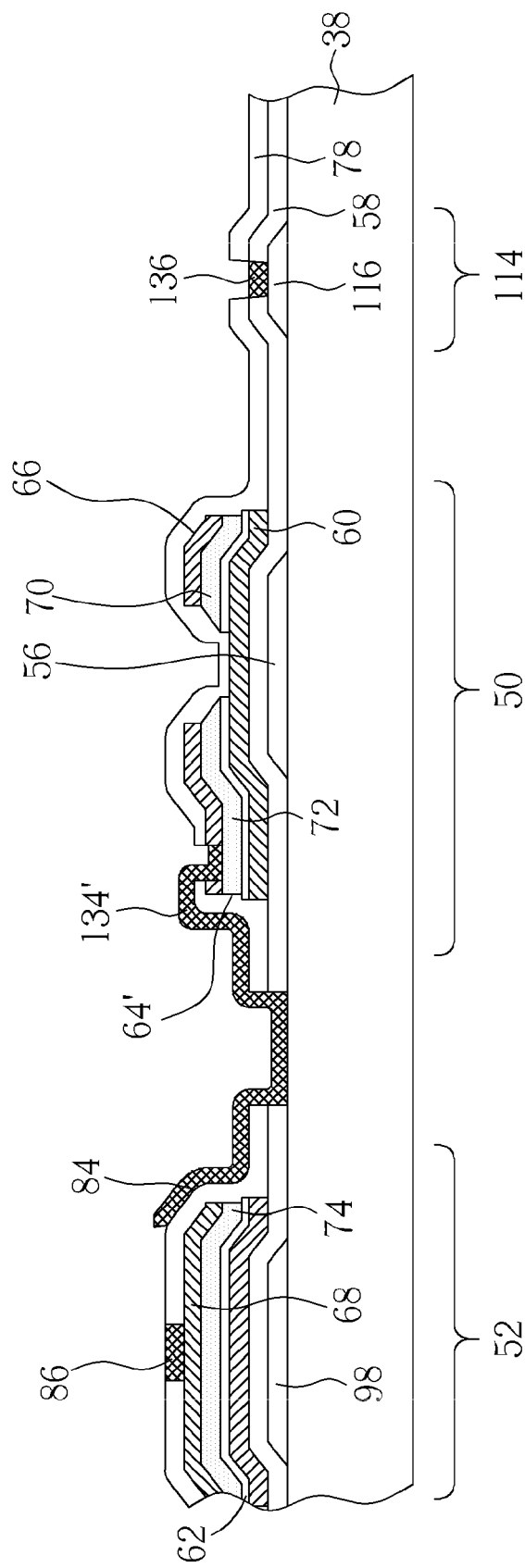

As shown in FIG. 21, an etching process is performed using the patterned photoresist layer 118 as an etching mask to partially remove the passivation layer 78, the silicon-rich dielectric layer 66, and the gate insulating layer 58. After the etching process, an opening 128 is formed in the passivation layer 78 in the sensor region 52, a through hole 130 partially exposing the drain electrode 72 is formed, a pad opening 132 exposing the bottom pad 116 is formed, and a portion of the photoresist layer 118' corresponding to the opaque region 126a is reserved. As shown in FIG. 22, a transparent conductive layer 134 is entirely formed on the substrate 38. As shown in FIG. 23, a lift-off process is performed to remove the photoresist layer 118' and the transparent conductive layer 134 disposed on the surface of the photoresist layer 118' simultaneously, and the transparent conductive layer 134' not disposed on the photoresist layer 118' is reserved. The remaining transparent conductive layer 134 includes a top electrode 86 disposed in the sensor region 52, a pixel electrode 84 electrically connected to the drain electrode 72 in the TFT region 50, and a top pad 136 in the pad region 114, where the top pad 136 and the bottom pad 116 are electrically connected together, forming a pad 32 as shown in FIG. 1.

As described, the photo sensor can be formed with only three to six masks, integrated into the fabrication of TFT of the amorphous silicon TFT display panel, and therefore the process steps are simplified and the cost is reduced. In addition, the photo sensor of the present invention can be formed outside the display region of the display panel and used as an ALS, or can also be formed inside each pixel of the display region and used as a color image sensor by co-operating with the color filters of the display panel or by adjusting the pattern of the photosensitive material of the silicon-rich dielectric layer. Alternatively, the amorphous silicon TFT display panel can be an optical touch panel or a finger print sensor by connecting the photo current generated by the photo sensor to related circuit design.

Figure 24:
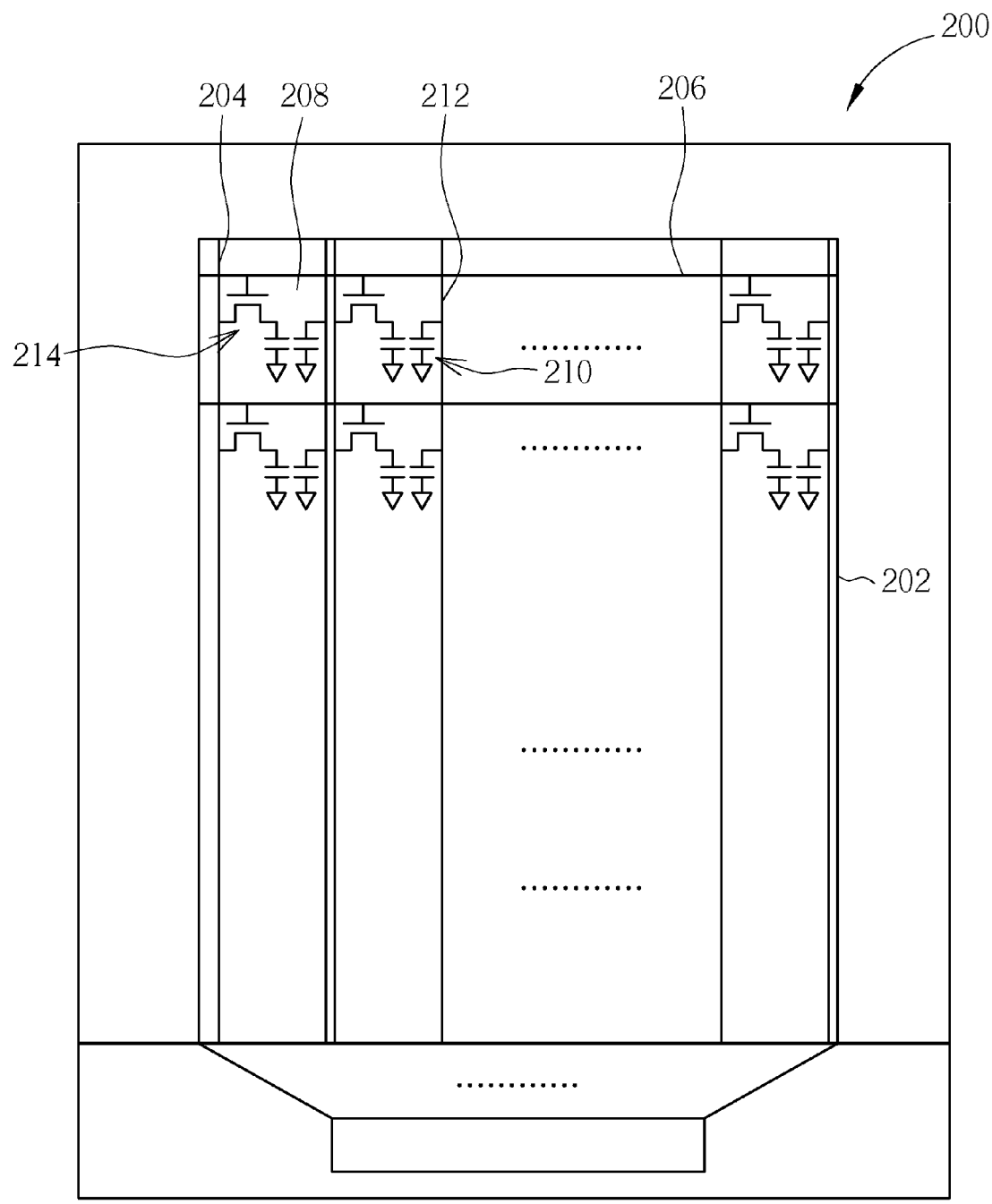
FIG. 24 illustrates a circuit diagram of an optical touch panel or a finger print sensor using the photo sensor of the present invention.

FIG. 24 illustrates a circuit diagram of an optical touch panel or a finger print sensor using the photo sensor of the present invention. As shown in FIG. 24, the optical touch panel 200 includes a display region 202, a plurality of signal lines 204 and read-out lines 212 arranged in parallel, a plurality of scan lines 206 perpendicular to the signal lines 204, and a plurality of pixels 208 defined by the signal lines 204 and the scan lines 206 and arranged in matrix. Each of the pixels 208 includes a TFT 214 electrically connected to the signal line 204, and at least a photo sensor 210 electrically connected to the read-out line 212. When a user touches the surface of the optical touch panel 200 at a certain location, the surface corresponding to this location is shielded. Consequently, the photo current of the photo sensor 210 corresponding to this location will change, and this current change will be read out by the read-out line 212 so that the location where the user touches is detected.

In comparison with the prior art, the photo sensor using silicon-rich dielectric material has excellent product reliability. The signal-to-noise ratio can reach 200 to 300 when used in UV-blue sensors. Particularly, the process of forming the photo sensor using silicon-rich dielectric material is integrated into the process of amorphous silicon TFT. By virtue of redesigning the sequence of photolithographic process and deposition process, the process steps, manufacturing cost, and cycle time can be reduced. Furthermore, the photo sensor using silicon-rich dielectric material can be used in touch panel, which can reduce the manufacturing cost of touch panel, and also provide value-added for the product.

Those skilled in the art will readily observe that numerous modifications and alterations of the device and method may be made while retaining the teachings of the invention.

What is claimed is:

1. A method of fabricating a photo sensor on an amorphous silicon TFT panel, comprising:

providing a substrate comprising a TFT region and a sensor region;

forming a first patterned conductive layer on the substrate, the first patterned conductive layer comprising a gate electrode of a TFT disposed in the TFT region;

forming a gate insulating layer on the substrate and the gate electrode;

forming a patterned amorphous silicon layer on the gate insulating layer corresponding to the gate electrode;

forming a second patterned conductive layer on the substrate, wherein the second patterned conductive layer comprises a source electrode, a drain electrode and a bottom electrode of a photo sensor, the source electrode and the drain electrode are disposed above the gate electrode, and the bottom electrode is disposed in the sensor region;

forming a patterned silicon-rich dielectric layer on the substrate, the patterned silicon-rich dielectric layer comprising being disposed in the sensor region and electrically connected to the bottom electrode, and the patterned silicon-rich dielectric layer at least partially exposing the drain electrode; and forming a patterned transparent conductive layer on the substrate, the patterned transparent conductive layer at least comprising a top electrode disposed in the sensor region.

2. The method of claim 1, wherein the patterned silicon-rich dielectric layer comprises a compound of silicon, oxygen, nitrogen, carbon, or hydrogen.

3. The method of claim 1, wherein a molecular formula of the patterned silicon-rich dielectric layer comprises SiOC, SiC, SiOx, SiNx, SiONy, SiOH, or a mixture thereof.

4. The method of claim 1, wherein forming the patterned silicon-rich dielectric layer comprising:

forming a silicon-rich dielectric layer on the substrate, wherein forming the silicon-rich dielectric layer comprises performing a chemical vapor deposition process; and subsequently performing a photolithographic and etching process to pattern the silicon-rich dielectric layer.

5. The method of claim 4, comprising introducing a gas comprising silicon, oxygen, nitrogen, carbon, hydrogen, or a mixture thereof in the chemical vapor deposition process.

6. The method of claim 1, wherein the patterned silicon-rich dielectric layer partially covers the source electrode and the drain electrode.

7. The method of claim 1, further comprising forming a patterned passivation layer on the substrate covering the TFT and partially exposing the drain electrode and the patterned silicon-rich dielectric layer subsequent to forming the patterned silicon-rich dielectric layer.

8. The method of claim 7, wherein the patterned passivation layer comprises an organic photoresist material.

9. The method of claim 8, wherein forming the patterned passivation layer comprises:

forming an organic photoresist layer entirely covering the substrate subsequent to forming the patterned silicon-rich dielectric layer;

performing an exposure process to define a through hole pattern and an opening pattern in the organic photoresist layer, wherein the through hole pattern is disposed in the TFT region and the opening pattern is disposed in the sensor region; and performing a development process to remove the organic photoresist layer of the through hole pattern and the opening pattern to form the patterned passivation layer.

10. The method of claim 7, wherein forming the second patterned conductive layer, the patterned silicon-rich dielectric layer, and the patterned passivation layer comprises:

consecutively forming a second conductive layer and a silicon-rich dielectric layer entirely covering the substrate;

partially removing the second conductive layer and the silicon-rich dielectric layer simultaneously to form the second patterned conductive layer, and to make the silicon-rich dielectric layer and the second patterned conductive layer have the same pattern in the sensor region;

forming a dielectric layer entirely on the substrate; and performing a photolithographic and etching process using a halftone mask to partially remove the dielectric layer and the silicon-rich dielectric layer simultaneously to form the patterned silicon-rich dielectric layer, and to make the dielectric layer form the patterned passivation layer partially exposing the drain electrode and the patterned silicon-rich dielectric layer.

11. The method of claim 10, wherein the halftone mask comprises a translucent region, and a portion of the translucent region is corresponding to the silicon-rich dielectric layer or the sensor region.

12. The method of claim 1, wherein forming the patterned amorphous silicon layer and the second patterned conductive layer comprises:

consecutively forming an amorphous silicon layer, a second conductive layer, a silicon-rich dielectric layer and a photoresist layer on the substrate subsequent to forming the gate insulating layer;

applying a halftone mask to define patterns of the source electrode, the drain electrode, the bottom electrode and a semiconductor channel of the TFT in the photoresist layer; and performing an etching process using the photoresist layer as an etching mask to partially remove the silicon-rich dielectric layer, the second conductive layer, and the amorphous silicon layer simultaneously, wherein the remaining silicon-rich dielectric layer and the remaining second patterned conductive layer have substantially identical patterns, which partially expose the amorphous silicon layer in the TFT region.

13. The method of claim 12, wherein the halftone mask comprises a translucent region and an opaque region, the translucent region is corresponding to the semiconductor channel, and the opaque region is corresponding to the drain electrode, the source electrode and the bottom electrode.

14. The method of claim 1, further comprising forming a passivation layer on the substrate covering the TFT and partially exposing the drain electrode and the bottom electrode prior to forming the patterned silicon-rich dielectric layer.

15. The method of claim 1, further comprising defining the gate electrode, the patterned amorphous silicon layer, the source electrode and the drain electrode, the patterned silicon-rich dielectric layer, and the patterned transparent conductive layer respectively with five masks.

16. The method of claim 1, wherein the patterned transparent conductive layer comprises a pixel electrode electrically connected to the drain electrode.

17. The method of claim 1, wherein forming the patterned amorphous silicon layer, the second patterned conductive layer and the patterned silicon-rich dielectric layer comprising:

consecutively forming an amorphous silicon layer, a second conductive layer, and a silicon-rich dielectric layer entirely on the substrate; and performing a photolithographic and etching process to partially remove the amorphous silicon layer, the second conductive layer and the silicon-rich dielectric layer simultaneously to form a semiconductor channel in the TFT region, the source electrode and the drain electrode on the gate electrode, and the bottom electrode and the patterned silicon-rich dielectric layer in the sensor region.

18. The method of claim 17, wherein prior to forming the patterned transparent conductive layer, the method further comprises:

consecutively forming a passivation layer and a photoresist layer on the substrate;

performing a photolithographic process using a halftone mask to pattern the photoresist layer, wherein the patterned photoresist layer comprises a through hole pattern and an opening pattern; and performing an etching process using the patterned photoresist layer as an etching mask to partially remove the passivation layer and the silicon-rich dielectric layer in the TFT region, and partially remove the passivation layer in the sensor region simultaneously so as to form a through hole in the TFT region and an opening in the sensor region.

19. The method of claim 18, wherein the halftone mask comprises a translucent region corresponding to the opening pattern, and a transparent region corresponding to the through hole pattern.

20. The method of claim 18, further comprising:
forming a transparent conductive layer entirely covering the substrate; and
performing a lift-off process to remove the patterned photoresist layer and the transparent conductive layer disposed on the patterned photoresist layer so as to from the patterned transparent conductive layer.

21. The method of claim 1, wherein the substrate further comprises a pad region, and the method further comprises:
forming a bottom pad in the pad region simultaneously when forming the gate electrode; and
forming a top pad on the bottom pad simultaneously when forming the patterned transparent conductive layer.

22. The method of claim 1, wherein the silicon-rich dielectric layer comprises silicon nanocrystalline material.

23. The method of claim 1, wherein the bottom electrode comprises metal material.

* * * * *